(12) United States Patent
Funaya et al.

(10) Patent No.: US 6,798,070 B2
(45) Date of Patent: Sep. 28, 2004

(54) ELECTRONIC DEVICE ASSEMBLY AND A METHOD OF CONNECTING ELECTRONIC DEVICES CONSTITUTING THE SAME

(75) Inventors: Takuo Funaya, Tokyo (JP); Tadanori Shimoto, Tokyo (JP); Naoji Senba, Tokyo (JP); Koji Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/730,849

(22) Filed: Dec. 7, 2000

(65) Prior Publication Data

US 2001/0003656 A1 Jun. 14, 2001

(30) Foreign Application Priority Data

Dec. 10, 1999 (JP) ............................................. 11-351226

(51) Int. Cl.[7] ......................... H01L 23/48; H01L 23/52; H01L 29/40
(52) U.S. Cl. ....................................... 257/777; 257/734
(58) Field of Search ................................ 257/734, 737, 257/772, 776, 777, 778, 780, 782, 779, 783

(56) References Cited

U.S. PATENT DOCUMENTS 4,744,008 A * 5/1988 Black et al. ................. 361/386
5,283,468 A * 2/1994 Kondo et al. ............... 257/774
5,821,624 A * 10/1998 Pasch .......................... 257/776

FOREIGN PATENT DOCUMENTS

| JP | 63-142663 A | 6/1988 |
|---|---|---|
| JP | 5-13663 | 1/1993 |
| JP | 6-244360 | 9/1994 |
| JP | 7-297359 | 11/1995 |
| JP | 10-22449 | 1/1998 |
| JP | 10-135404 A | 5/1998 |
| JP | 11-195746 | 7/1999 |
| JP | 2000-82723 A | 3/2000 |
| JP | 2000-243904 A | 9/2000 |

* cited by examiner

*Primary Examiner*—David Nhu
(74) *Attorney, Agent, or Firm*—Sughrue Mion, PLLC (57) ABSTRACT

An electronic device assembly for dense mounting of electronic devices and method of connecting the electronic devices are disclosed. Conductive portions implemented by metal bumps and sealing portions implemented by adhesive seal resin are connected by thermocompression at the same time between two electronic devices. This may be repeated between three or more electronic device.

8 Claims, 5 Drawing Sheets

ELECTRONIC DEVICE ASSEMBLY AND A METHOD OF CONNECTING ELECTRONIC DEVICES CONSTITUTING THE SAME

BACKGROUND OF THE INVENTION

The present invention relates to the mounting structure of electronic devices and more particularly to an electronic device assembly promoting dense mounting of electronic devices and a method of connecting the devices.

To implement rapid processing and advanced functions, a semiconductor package with a plurality of functions, including memory and logic, arranged on a single semiconductor chip is attracting increasing attention. For example, Japanese Patent Laid-Open Publication Nos. 11-195746, 10-22449 and 5-13663 teach COC (Chip On Chip) structures. Japanese Patent Laid-Open Publication Nos. 7-297359 and 6-244360 disclose tridimensional mounting methods that connect semiconductor chips to circuit boards and then stack the circuit boards. Such conventional technologies, however, have the following problems (1) through (4) left unsolved.

(1) Arranging electronic devices having different functions on a single semiconductor chip results in an increase in chip size. This, in turn, increases the production cost for a chip and lowers the yield of a production line.

(2) The COC structures taught in the above-mentioned Laid-Open Publication Nos. 11-195746, 10-22449 and 5-13663 are not practicable without increasing the size of packages. Specifically, semiconductor chips separate from each other different in function each have a smaller area than a single semiconductor chip having various functions integrated thereon. The separate chips, however, increase the overall thickness and therefore the volume of a package when assembled together.

(3) It is necessary with the COC structure to cause underfill resin to flow into a gap between the active surfaces of semiconductor devices after the connection of the devices. The flow of the underfill resin into the above gap becomes more difficult as the pitch of bumps formed on a semiconductor device or the gap between two active surfaces decreases. As a result, irregular bubbles are left in the resin layer and structurally degrade long-range reliability. Further, the underfill resin sometimes reaches regions of the circuit surface of a semiconductor device where the resin would effect a device characteristic.

(4) The tridimensional mounting structures disclosed in Laid-Open Publication Nos. 7-297356 and 6-244360 each connect the individual semiconductor device to a preselected circuit board and then stack such circuit boards. Consequently, even semiconductor devices having small pad pitches or area bump arrays are connected to circuit boards before the stacking of circuit boards. As a result, the circuit boards have peripheral bump arrays. This increases the overall volume of the assembly, compared to an assembly in which circuit boards do not intervene between semiconductor devices.

SUMMARY OF THE INVENTION

It is therefore an object of the present invention to provide an electronic device assembly allowing two or more electronic devices to be connected together and allowing not only semiconductor devices and other active devices but also capacitors, resistors and other passive devices and a circuit board to be connected together, and a method of connecting the electronic devices.

It is another object of the present invention to provide an electronic device assembly allowing two or more electronic devices to be connected together without resorting to underfill resin, which would cause voids to remain therein after curing, and a method of connecting the electronic devices.

It is yet another object of the present invention to provide an electronic device assembly allowing a SAW (Surface Acoustic Wave) filter to be connected to another electronic device while being hermetically sealed at the same time and allowing another electronic device to be connected to the above electronic device by flip chip bonding, and a method of connecting the electronic devices.

It is a further object of the present invention to provide an electronic device assembly implementing tridimensional dense mounting without resorting to a carrier circuit board, and a method of connecting electronic devices constituting the assembly.

In accordance with the present invention, in an assembly in which a plurality of electronic devices of different kinds are connected to a single electronic device, the electronic devices are connected to each other by conductive portions implemented by metal, but insulated from each other by insulating portions implemented by an adhesive, sealable patterned resin layer.

Also, in accordance with the present invention, in a method of connecting at least two electronic devices included in an assembly in which a plurality of electronic devices of different kinds are connected to a single electronic device, the electronic devices are connected to each other by conductive portions implemented by metal, but insulated from each other by insulating portions implemented by an adhesive, sealable patterned resin layer. The method includes a step of subjecting the adhesive, sealable resin and electrodes to thermocompression at the same time.

Further, in accordance with the present invention, in a method of connecting at least two electronic devices included in an assembly in which a plurality of electronic devices of different kinds are connected to a single electronic device, the electronic devices are connected to each other by conductive portions implemented by metal, but insulated from each other by insulating portions implemented by an adhesive, sealable patterned resin layer. A first step connects the conductive portions by applying an ultrasonic wave while holding bumps and electrode pads aligned with the bumps in contact with each other. A second step connects a resin layer formed on any one of the electronic devices and a contact surface formed on a function element corresponding to the resin layer by thermocompression. The second step is executed after or simultaneously with the first step.

Moreover, in accordance with the present invention, in a method of constructing an assembly in which a plurality of electronic devices of different kinds are connected to a single electronic device, the electronic devices are connected to each other by conductive portions implemented by metal, but insulated from each other by insulating portions implemented by an adhesive, sealable and patterned resin layer. The method includes a step of connecting at least two electronic devices via thermosetting, sealable resin layer while maintaining, on a passive device mounted on any one of the electronic devices or on the circuit surface of the electronic device, a temperature of portions where resin constituting the resin layer would effect a device characteristic higher than a temperature of the other portions.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
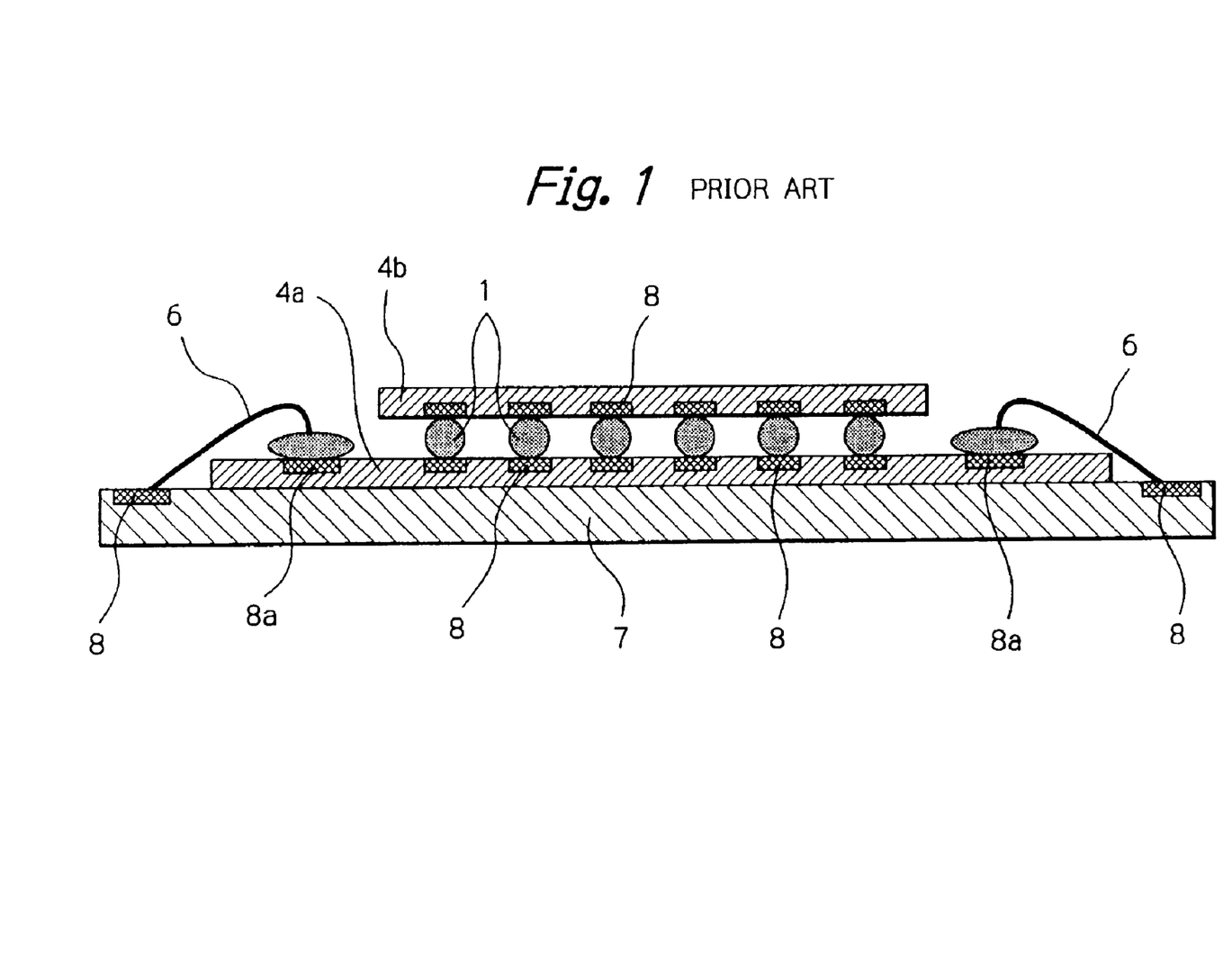
FIG. 1 is a sectional view showing two semiconductor devices connected together by a conventional technology.

To better understand the present invention, brief reference will be made to a COC structure implemented by a conventional technology, shown in FIG. 1. As shown, the COC structure includes two semiconductor devices (simply devices hereinafter) 4a and 4b each having electrode pads on one surface thereof. The device 4a has an active surface broader than the active surface of the device 4b and is positioned below the device 4b. The electrode pads 8 of the device 4a and the electrode pads 8 of the device 4b are connected together via bumps 1 by flip chip bonding. The electrode pads 8 positioned at the edge portions of the device 4a are connected to electrode pads 8 formed on the surface of a circuit board 7. After the devices 4a and 4b have been connected together, underfill resin is fed in order to fill the gap between the devices 4a and 4b. This COC structure, however, has some problems left unsolved, as stated earlier.

The principle of the present invention, which is a solution to the problems, will be described hereinafter. In accordance with the present invention, conductive portions and insulating portions are implemented by metal bumps and adhesive seal resin, respectively. The connection of the conductive portions and that of the insulating portions are effected at the same time by thermocompression.

Figure 2:
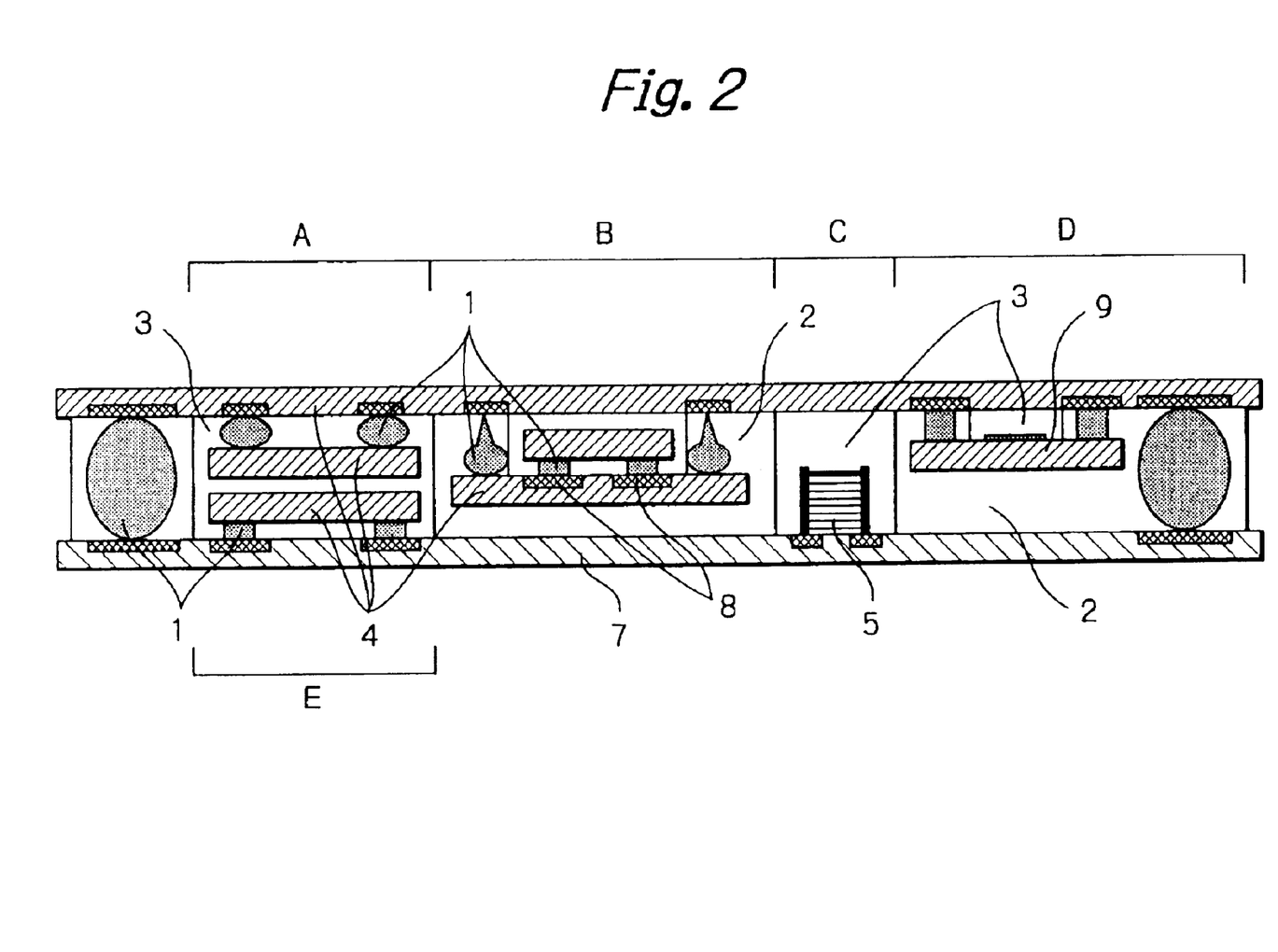
FIG. 2 is a sectional view showing an electronic device assembly embodying the present invention.

To further reduce the mounting time, the connection of bumps using an ultrasonic wave and the connection of seal resin using heat are effected at the same tine. Therefore, as shown in FIG. 2 of the drawings, it is possible to connect not only semiconductor devices or similar active devices 4 via bumps 1 (region A or B), but also a capacitor or similar passive device 5 and a circuit board 7 (region C), a SAW filter or similar function device 9 and the active device 4 (region D), and the active device 4 and circuit board 7.

Photosensitive, adhesive seal resin 2 can be removed beforehand from the portions of a chip circuit surface where it would effect a device characteristic, e.g., an I.D.T. electrode portion included in the SAW filter 9. The seal resin 2 can therefore hermetically seal the package and insure reliable connection without flowing into gaps 3 between the electronic devices. Further, three or more chips may be stacked in the direction of height, if desired. This promotes dense mounting of electronic devices. In FIG. 2, the reference numeral 8 designates electrode pads.

As stated above, in accordance with the present invention, conductive portions and insulating portions are connected together by adhesive seal resin and metal, respectively, without regard to the function of an active or a passive device. It is therefore possible not only to connect a semiconductor device and another active device, as taught in the previously mentioned Laid-Open Publication Nos. 10-22449 and 5-13663, but also to assemble other various electronic devices.

The adhesive seal resin is so patterned as to be absent around passive devices mounted between electronic devices and around electrode pads and bumps formed on the circuit surfaces of electronic devices. This prevents the seal resin from penetrating into the interfaces between the pads and the bumps and thereby insures reliable electric connection with a minimum of connection resistance.

Electronic devices can be interconnected without damaging passive devices, which are mounted between electronic devices beforehand, due to a connection load. The resulting structure is therefore more rigid than the conventional structure in which only bumps are connected after the connection of electronic devices.

In accordance with the present invention, a method of assembling electronic devices connects the devices by connecting conductive portions, or bumps, by use of thermocompression or by applying an ultrasonic wave with a light load at low temperature around room temperature. The devices are therefore connected at the above relatively low temperature by the photosensitive, thermosetting seal resin. If the seal resin has tackiness and low elasticity, the insulating portions can be connected by thermocompression in a short period of time at low temperature with low stress. The conductive portions can therefore be connected in about 1 second when use is made of an ultrasonic wave, while the insulating portions can be connected in about 1 second. The total connecting time is as short as 2 seconds. This, coupled with the fact that the method of the present invention does not need underfill resin after the connection of electronic devices, reduces the connecting time to a considerable degree and enhances productivity.

Assume that a gap between two electronic devices is as small as about 50 $\mu$m or less. Then, the method of the present invention obviates voids ascribable to bubbles that would remain in an underfill resin layer between electronic devices. The method therefore enhances the reliability of an electronic device assembly or product.

In accordance with the present invention, photosensitive resin is used as the adhesive seal resin to be deposited on an electronic device in the form of a layer. After the resin has been removed from, e.g., the I.D.T. electrode portion of a SAW filter where the resin would effect a device characteristic, the periphery of a package may be sealed by hermetic seal welding or similar means after the connection of electronic devices. In accordance with the present invention, sealing can be effected at the same time as the connection of electronic devices. Further, as shown in FIGS. 3A through 3D, another electronic device may be connected to an electronic device to which a SAW filter has been connected.

In accordance with the present invention, in the case where photosensitive, adhesive seal resin is patterned, use is made of resin whose aspect ratio is 1. Such resin can be patterned with a thickness of 10 $\mu$m and a pitch of about 10 $\mu$m that meet the increasing demand for a small pitch, area bump layout. This allows electronic devices to be mounted tridimensionally without resorting to a carrier circuit board.

A preferred embodiment of the present invention will be described with reference to FIGS. 3A through 3D, 4A through 4E and be 5A through 5D. Some different preprocessing may be selectively effected before the connection of electronic devices, depending on the configuration of each electronic device. An electronic device may advantageously be implemented as Si, GaAs, LiTaO3. LiNbO3, quartz or the like, on which wiring is formed, or a capacitor, a resistor or similar chip part and a silicon circuit board, a printed circuit board, a flexible circuit board or similar organic circuit board or an alumina circuit board, glass ceramics circuit board, glass circuit board or similar ceramics circuit board.

Hereinafter will be described three specific cases, i.e., a case wherein bumps are formed on an electronic device before connection, a case wherein a seal resin layer is formed on an electronic device before connection, and a case wherein bumps and a seal resin layer both are formed on an electronic device before connection. In practice, an electronic device with a seal resin layer is connected to an electronic device formed with bumps. Also, an electronic device not subjected to any preprocess before connection is connected to an electronic device formed with bumps and a seal resin layer.

Assume an electronic device in the form of a wafer and formed with electrode pads. Then, bumps of pure metal or alloy are formed on the electrode pads by plating, studding, ball transfer or printing, depending on the thermal resistance of the device and circuit board, the pitch and size of the pads, and other various conditions. A procedure for forming bumps by plating will be described with reference to FIGS. 4A through 4E.

Figure 4A:
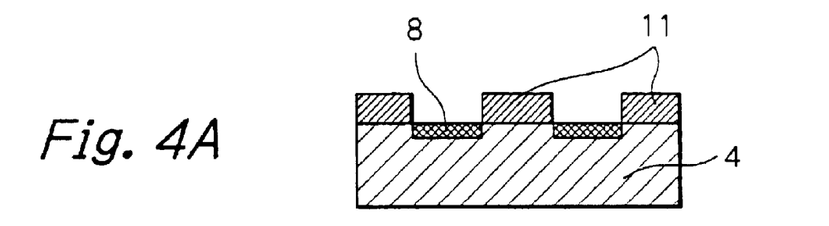
FIGS. 4A through 4E are sectional views demonstrating a procedure for forming Bumps by plating.
Figure 4B:
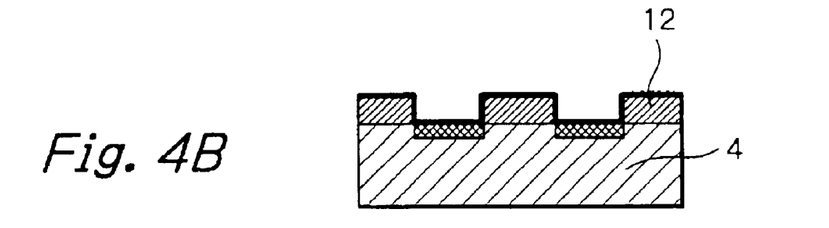
Figure 4C:
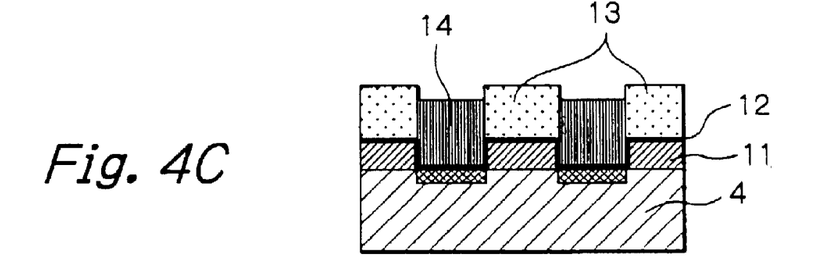

As shown in FIG. 4A, a function device 4 has an active surface on which a passivation film 11 and electrode pads 8 are exposed. As shown in FIG. 4B, a conductive thin film 12, which is about 0.01 $\mu$m to about 1 $\mu$m, is formed on the active surface of the device 4 by a sputtering system or a vapor deposition system. The thin film 12 may be a laminate of Ti and Pd, a laminate of Cr and Pd or a laminate of Cr and Cu by way of example. Subsequently, as shown in FIG. 4C, the thin film 12 is coated with an about 1 $\mu$m to 100 $\mu$m thick resist 13 by, e.g. a roller coater, curtain-flow coater, screen printing or spin coater. The resist 13 is then exposed and developed in a pattern in which it is present on the passivation film 11, but absent on the electrode pads 8. Thereafter, bumps 14 are formed on the electrode pads 8 via the thin film 12 by electrolytic plating.

When Au is used for the bumps 14, there are sequentially executed, e.g., Ni plating, Au strike plating, and an Au plating in this order. Au bumps may, of course, be replaced with Cu bumps or Ag bumps formed by electrolytic plating. Further, the bumps 13 may be implemented as Au stud bumps, Au bumps formed by ball transfer, in bumps, solder bumps, Cu bumps, ball bumps of alloy or solder bumps formed by the printing and reflow of solder paste.

Figure 4D:
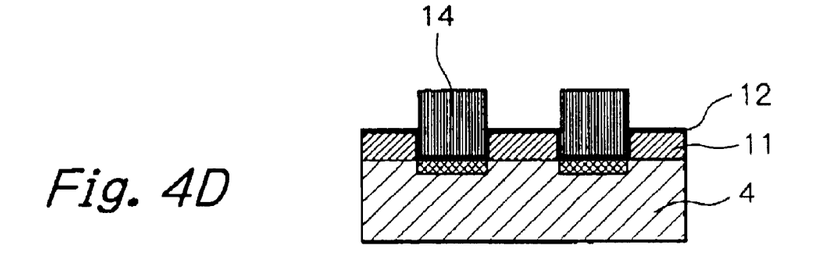
Figure 4E:
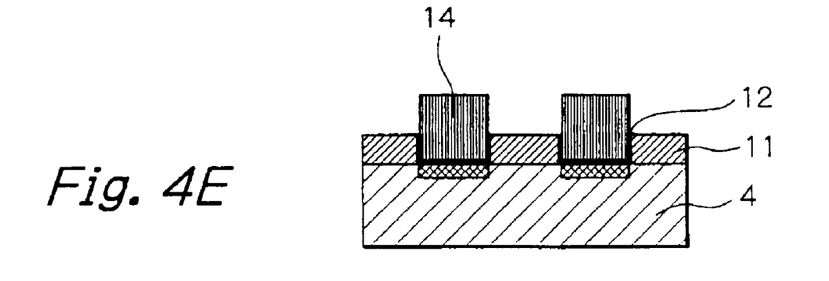

Subsequently, as shown in FIG. 4D, the resist 13 is removed by wet etching using MEK, alcohol or similar solvent. Further, as shown in FIG. 4E, the conductive film 12 on the passivation film 11 is removed by wet etching or dry etching. Finally, the device 4 is cut away from the wafer by dicing.

Bumps for an electronic device not taking the form of a wafer may advantageously be implemented by, but not limited to, Au stud bumps, Au bumps formed by ball transfer, In bumps, solder bumps, Cu bumps, alloy ball bumps or solder bumps formed by the printing and reflow of solder paste.

A seal resin layer is formed on an electronic device implemented as a wafer, as follows. Photosensitive, thermosetting seal resin is coated on the device to a thickness of 1 $\mu$m to 100 $\mu$m by, e.g., a roller coater, a curtain-flow coater, screen printing or a spin coater and then dried. Subsequently, not only the seal resin layer around the pads and bumps, but also the seal resin around circuit board wiring protruding from another electronic device to be connected, are removed by exposure and development via a photomask. Further, when a passive device is mounted on another electronic device to be connected the above seal resin around the passive device is removed. In addition, the seal resin is removed from portions where it would effect the device characteristic of another device.

Finally, the device is cut away from the wafer by dicing. Even when the device is not implemented as a wafer, resin is applied to the device by, e.g., dipping, a roller coater, a curtain-flow coater, screen printing or a spin coater. This is also followed by exposure and development.

In accordance with the present invention, there may be effected the steps of forming bumps on an electronic device and then forming a desired resin pattern.

Assume that the electronic device subjected to such preprocessing and another electronic device are connected together. Then, the photosensitive, thermosetting seal resin layer exists between the function device and the circuit board. On the other hand, in the gap between the active surfaces of the two devices, the seal resin layer is absent around a coil (L), capacitor (C), resistor (R) or similar passive device mounted on the device. Also, the seal resin layer is absent around portions where it would effect the device characteristic of the device to be connected, portions around the pads, and portions around the bumps.

Another electronic device may be connected to the above assembly of two electronic devices by repeating the above-described preprocessing and connection. In this manner, a plurality of electronic devices can be assembled together. As for the photoconductive, thermosetting resin, use may be made of, e.g., V-259PA (trade name) available from Nippon Steel Chemical Co., Ltd. whose viscosity ranges from 200 cps to 1,000 cps, a polyimide precursor PAIMEL (trade name) available form ASAHI CHEMICAL INDUSTRY CO., LTD, or SUMIRESIN (trade name) available from Sumitomo Bakelite Co., Ltd.

A layer of such resin plays the role of a passivation film at the same time when coated on a semiconductor device. If desired, a resin sheet thicker than 100 $\mu$m may be adhered to an electronic device and then subjected to exposure and development.

To connect the two or more electronic devices, use is made of a flip-chip mounter for thermocompression or a flip-chip mounter capable of applying an ultrasonic wave. A tool included in the mounter retains one of the devices by vacuum while a stage also included in the mounter retains the other device by vacuum.

Figure 3A:
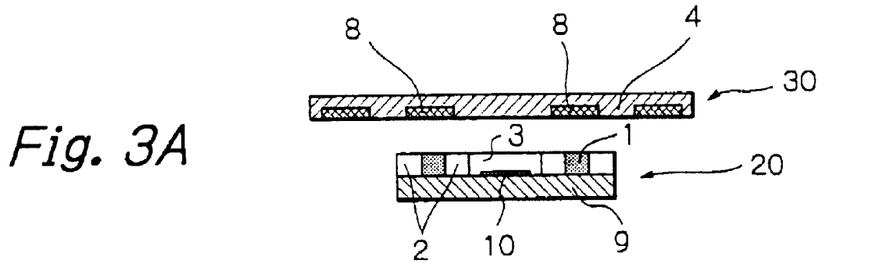
FIGS. 3A through 3D are sectional views demonstrating a procedure for connecting an assembly of a SAW filter and a semiconductor device to another semiconductor device.
Figure 3B:
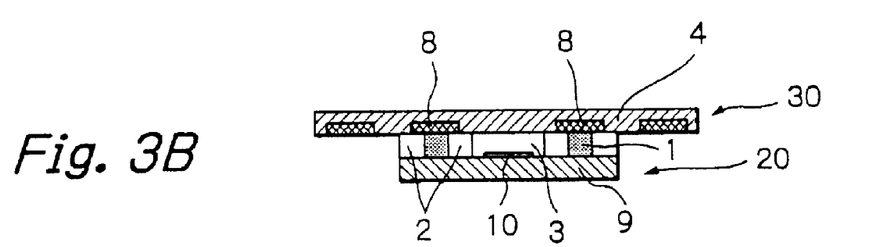

A procedure for connecting two electronic devices will be described with reference to FIGS. 3A through 3D. First, two electronic devices are positioned relative to each other. Then, as shown in FIG. 3A, bumps 1 formed on one device 20 and electrode pads 8 formed in the other device 30 and aligned with the bumps 1 are caused to contact each other and then bonded by thermocompression or an ultrasonic wave. As shown in FIG. 3B, at the same time as or after the thermocompression or ultrasonic bonding, a load sufficient to smash the bumps 1 and bring the surface of a photosensitive, thermosetting resin layer 2 formed on the device 20 into contact with the surface of the device 30 is applied. In this condition, the devices 20 and 30 are heated to connect the seal resin layer 2, which exist in insulating portions, to the surface of the device 30. To prevent the seal resin 2 from flowing out during connection, dents may be formed in the portions of a circuit board expected to contact the seal resin 2 beforehand.

As stated above, by patterning resin and forming bumps on either one of the electronic devices 20 and 30 in the same manner as on a circuit board before connection, it is possible to connect the devices 20 and 30 together to complete a device assembly. It is noteworthy that the resin 2 is so patterned as to be absent in various undesirable portions stated earlier.

A plurality of device assemblies each having the above-described structure are introduced into a drier together in order to cure the photosensitive, thermosetting seal resin. If desired, another seal resin may be dropped onto the periphery of each device assembly via a dispenser and then cured together with the photosensitive, thermosetting resin in the drier.

A specific example of the illustrative embodiment will be described hereinafter. In this example, bumps and a resin pattern were formed on a semiconductor device. Specifically, eighty-one electrode pads each being sized 100 mm square were formed on a 3.5 mm×5.3 mm Si semiconductor device at a pitch of 150 μm. Au bumps each being 90 μm square were formed on all of the electrode pads.

First, as shown in FIG. 4A, an aluminum oxide film is removed from the active surface of a Si semiconductor device by reverse sputtering using a sputtering system Subsequently, as shown in FIG. 4B, a conductive thin film 12 made up of a 0.05 μm thick Ti thin layer and a 0.15 μm thick Pd thin layer was formed on the entire surface of the device by sputter vapor deposition in a thin film deposition system. The device was then taken out of the deposition system, coated with an about 25 μm thick resist by a spin coater, and then exposed and developed. As a result, as shown in FIG. 4C, a resin pattern 13 was formed on the device except for the positions around the electrode pads 8. Thereafter, as shown in FIG. 4D, the Au bumps 14 each being 20 μm high were formed by electrolytic plating, e.g., by the consecutive steps of Ni plating, Au strike plating, and Au plating.

After the formation of the Au bumps 14, the resist pattern 13 was removed by wet etching using MEK, alcohol or similar solvent. As shown in FIG. 4E, the conductive thin film 12 used for electrolytic plating was removed by wet etching or IBE or similar dry etching except for its portions corresponding to the bumps 1 and electrode pads 8.

In the condition shown in FIG. 4E, the device was coated with the previously mentioned photosensitive, thermosetting seal resin V-259PA by a spin coater to a thickness of about 22 μm. The seal resin was dried and then exposed and developed via a photomask, forming a resin pattern. At this instant, the seal resin was removed not only from the positions around the pads and bumps, but also from the positions expected to align with wiring protruding from another electronic device to be connected. Thereafter, the device was cut away by dicing. Let this device be referred to as a first Si device in distinction from a second Si device to be connected thereto.

As shown in FIGS. 5A through 5D, the first Si device was connected to the second Si device, which was-sized 10 mm×10 mm, by DB100 (trade name) available from SHIBUYA KOGYO CO., LTD. Specifically, a tool having an ultrasonic wave applying function and a pulse heating function retained the first Si device by vacuum while a stage having a constant heating function retained the second Si device by suction.

Figure 5A:
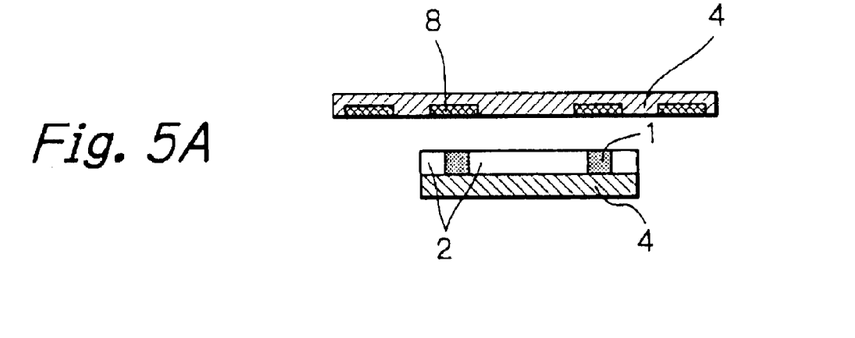
FIGS. 5A and 5D are sectional views showing a procedure for connecting a function device formed with bumps and a pattern of photoconductive, thermosetting resin and a circuit board for mounting it.
Figure 5B:
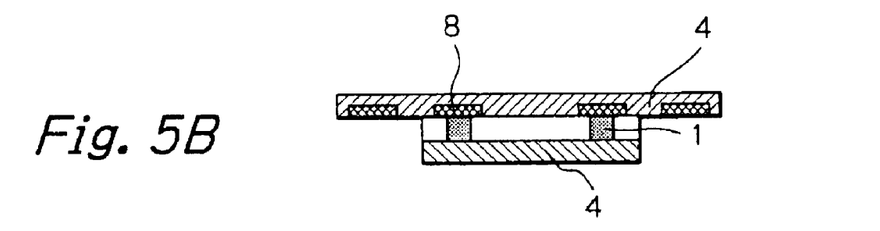

First, as shown in FIG. 5A, the first and second devices were positioned relative to each other by use of a camera. As shown in FIG. 5B, while the stage was held at room temperature, the bumps 1 of the first Si device and the electrode pads 8 of the second Si device were caused to contact each other and connected together by an ultrasonic wave emitted from the tool. The ultrasonic wave had a frequency of 40 kHz and an output of 3 W and was emitted for 0.6 second.

Subsequently, to connect the photosensitive, thermosetting seal resin 2 and second Si device by thermocompression, temperature was elevated from room temperature to 400° C. and held at 400° C. for 1 second. A load was increased up to 5 kg in accordance with the temperature elevation of a pulse heater, which is included in the tool. In this manner, the connection of the electrode pads 8 and bumps 1 and the connection of the two Si devices via the seal resin 2 were effected at the same time.

Figure 5C:
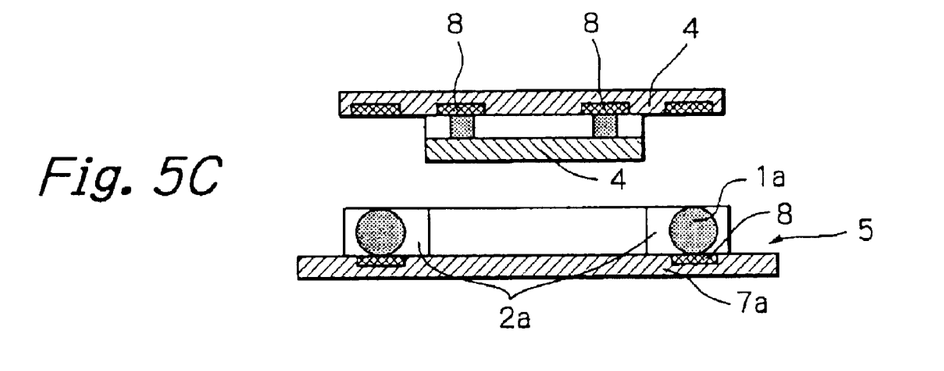

As shown in FIG. 5C, the subassembly of the first and second Si devices was connected to another or third semiconductor device 5. The third device 5 was made up of a glass epoxy substrate 7a, twenty solder ball bumps 1a arranged on the substrate 7a and each having a diameter of 650 m, and a sheet of thermosetting seal resin 2a. The seal resin 2a had an opening at its center and was 600 mm thick. The third device 5 was sized 10 mm×10 mm. The subassembly of the first and second devices was placed in the opening of the seal resin 2a.

Figure 5D:
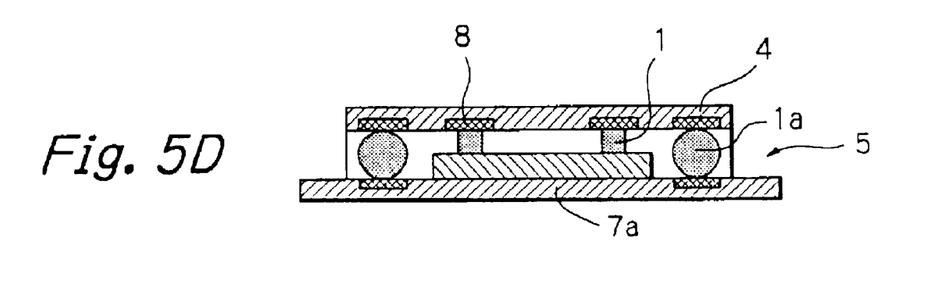

Subsequently, the seal resin 2a was removed from the 3.5 mm×5.3 m area of the third device 5 and the portions around the solder ball bumps 1a by exposure and development. Then, as shown in FIG. 5D, the subassembly and the third device 5 are connected together by thermocompression. The resulting assembly of the first to third devices withstood more than 1,000 cycles during a heat cycle test repeated at −40° C. to 125° C.

Another specific example of the illustrative embodiment will be described hereinafter. This example is practicable when bumps are formed on a first electronic device, when a seal resin layer is formed on a second electronic device to be connected to the first device, and when either one of the first and second devices includes a region whose device characteristic would vary if brought into contact with resin like the I.D.T. electrode portion of a SAW filter.

Specifically, Au stud bumps each having a diameter of about 100 μm and a height of about 25 μm were formed on Al pads provided on a LiTaO3, LiNbO3, quartz or similar wafer meant for a SAW filter. Thereafter, an electronic device was cut away from the wafer by dicing. An electronic device to be connected to the above device by flip chip bonding included a circuit board made of silicon, FT-4, glass ceramics or alumina and had a 0.03 mm to 0.3 mm deep recess in its region expected to form a resin pattern.

Impurities on the surface of a circuit board were removed by a plasma asher. The photosensitive, thermosetting seal resin V-259PA was coated on the above surface to a thickness of 20 μm to 50 μm and then dried. Subsequently, the seal resin was exposed and developed via a photomask and removed thereby from portions around the wiring of the circuit board and a portion corresponding to the I.D.T. electrode portion of a SAW chip to be connected later, completing a circuit board for mounting a function device. The function device and SAW chip was connected together by DB200 mentioned earlier.

Specifically, as shown in FIG. 3A, a tool, not shown, having a pulse heater and an ultrasonic wave applying function retained a SAW chip 20 by suction. At the same time, a stage having a pulse heater retained a circuit board 30 by suction. Bumps 1 and electrode pads 8 were formed on the SAW chip 20 and circuit board 30, respectively. As shown in FIG. 3B, while the bumps and electrode pads 8 are held in contact with each other, the tool emitted an ultrasonic wave in order to connect the bumps 1 and pads 8. The ultrasonic wave had a frequency of 40 kHz and an output of 3 W and emitted for 0.5 second. In FIGS. 3A and 3B, the reference numerals 3 and 9 designate a cavity and a SAW filter, respectively.

Subsequently, the seal resin 2 and SAW chip 20 were connected by thermocompression. At this instant, the device characteristic of the SAW chip 20 would vary if the seal resin 2 were brought into contact with an I.D.T. electrode portion included in the SAW chip 20. In light of this, the circuit board or the stage was held at a lower temperature than the SAW chip 20 or the tool throughout the thermocompression and cooling stage. This successfully caused organic gases derived from thermocompression condense and deposit on the circuit board 30 during cooling. The temperature of the pulse heater included in the tool was elevated from room temperature to 300° C. and held at 300° C. for 1 second. At the same time, the temperature of the pulse heater included in the stage was elevated from room temperature to 200° C. and held at 200° C. for 1 second. A load was increased up to 3 kg to 5 kg in accordance with the temperature elevation of the tool and that of the stage.

The SAW chip 20 and circuit board 30 were connected under the above conditions. Specifically, the Au bumps 1 connected the wiring portion of the SAW chip 20 and that of the circuit board 30, and then the seal resin 2 adhered the active surface of the SAW chip 20 and the surface of the circuit board 30. A plurality of such packages were dried together in a drier at 150° C. for 3 hours in order to cure the seal resin 2.

Assume that after the circuit board 30 has been coated with the seal resin 2, the SAW chip 20 and circuit board 30 are connected together by the conventional thermocompression scheme. Then, a period of time as long as about 20 seconds or more is necessary for the bumps 1 and electrode pads 8 to be bonded to each other. Moreover, the temperature of the stage retaining the circuit board 30 is selected to be higher than the temperature of the tool retaining the SAW chip 20 during thermocompression, causing excess resin 2 ascribable to temperature elevation to deposit on the I.D.T. electrode portion 10.

By contrast, in this example, no noticeable gaps occur between the SAW chip 20 and the seal resin 2 except for the position where the I.D.T. electrode portion 10 is located. Therefore, a load lighter than the conventional load suffices to bring the entire surface of the seal resin 2 into close adhesion to the SAW chip 20. In addition, there can be obviated the occurrence that excess resin 2 deposits on the I.D.T. electrode portion 10 during connection.

Figure 3C:
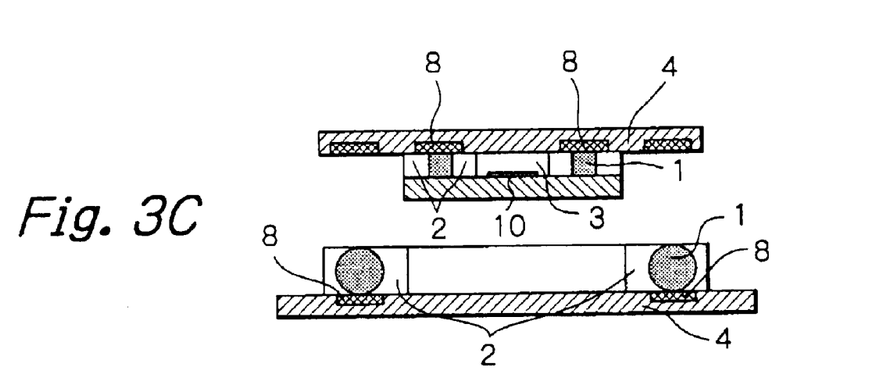
Figure 3D:
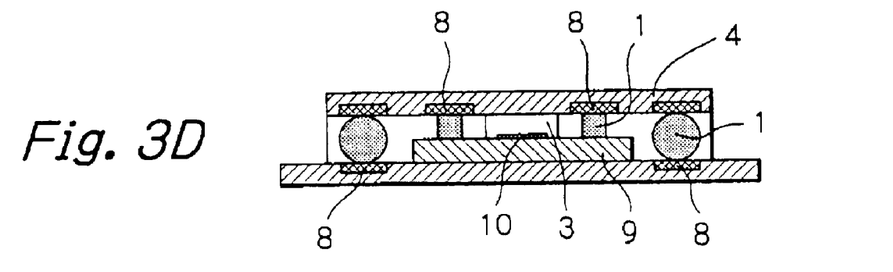

As shown in FIG. 3C, the subassembly of the SAW chip 20 and circuit board 30 was connected to a silicon circuit board 4 by thermocompression. A photosensitive, adhesive resin seat 2 accomodating solder balls 1 was adhered to the silicon circuit board 4 and was removed from around the bumps 1 and a region corresponding to the SAW chip 20 by exposure and development beforehand. The resulting assembly is shown in FIG. 3D. The SAW chip 20 was found to have a filter characteristic required of a SAW filter.

Assume that an ultrasonic wave is applicable to the connection of insulating portions implemented by photosensitive, thermosetting seal resin, which is patterned by exposure and development. Then, when bumps and electrode pads, i.e., conductive portions are connected by an ultrasonic wave, heat and load may be applied at the same time in order to connect even the insulating portions. After the connection, a plurality of such device assemblies are dried in a drier at the same time so as to cure the seal resin.

If desired, another seal resin may coat the periphery of the chips before the device assemblies or packages are introduced into the drier. In such a case, the above seal resin will be cured together with the photosensitive, thermosetting seal resin in the drier. Also, another electronic device in the form of a wafer may be connected so as to implement CSP at the wafer level.

Furthermore, when a plurality of relatively thin circuit boards are connected in a laminate, resin in the resin layer may be partly removed in order to bury a coil, capacitor, resistor or similar electronic device. This implements a structure in which a multifunction device is buried in a single circuit board.

In summary, in accordance with the present invention, two or more electronic devices can be connected together. Also, not only semiconductor devices and other active devices, but also capacitors, resistors and other passive devices and a circuit board can be connected together. These advantages are derived from the following unique configuration. Metal bumps connect conductive portions while adhesive seal resin connects insulating portions, implementing structurally rigid connection. Further, when use is made of photosensitive resin as seal resin, it can be so patterned as to be absent around wiring portions protruding from a circuit board, around passive elements mounted between electronic devices, around the portions of a circuit board of an electronic device where the resin would effect the device characteristic, and around bumps and electrode pads.

Also, in accordance with the present invention, two or more electrode devices can be connected without resorting to underfill resin conventionally fed after connection. This obviates an occurrence that voids appear in the underfill resin after the resin has been cured. Specifically, the connection of conductive portions using the bumps and that of insulating portions using the resin can be effected at the same time by an ultrasonic wave or thermocompression. Also, when use is made of photoconductive resin, the resin can be so patterned as to be absent around the bumps before connection even if the pitch of the bumps is small.

Further, in accordance with the present invention, when a SAW filter is connected to another electronic device, sealing is achievable at the same time as connection while still another electronic device is connectable to the above electronic device by flip chip bonding later. It has been customary to remove resin around, e.g., the I.D.T. electrode portion of a SAW filter that effects a device characteristic when brought into contact with resin, connect the SAW filter and an electronic device, and then seal the periphery of the resulting package by, e.g., hermetic seam welding.

Moreover, in accordance with the present invention, a three-dimensional mounting structure is achievable without regard to the arrangement of bumps and without the intermediary of a carrier circuit board. Specifically, assume that photosensitive, adhesive seal resin is patterned. Then, if the resin has an aspect ratio of 1, it can be patterned with a thickness of 10 $\mu$m and a pitch of about 10 $\mu$m. It follows that a resin pattern capable of coping with the decreasing pitch of an area bump layout is attainable.

Various modifications will become possible for those skilled in the art after receiving the teachings of the present disclosure without departing from the scope thereof.

What is claimed is:

1. An assembly of a plurality of electronic devices, comprising:

a first electronic device connected to other electronic devices by conductive portions formed of metal, but insulated from said other electronic devices by insulating portions that comprise an adhesive, sealable patterned resin layer;

a second electronic device connected to said first electronic device; and a third electronic device positioned between said first electronic device and said second electronic device and connected to said second electronic device, wherein the first, second and third electronic devices are stacked in the direction of height.

2. An assembly as claimed in claim 1, wherein said resin layer is photosensitive and thermosetting.

3. An assembly as claimed in claim 2, wherein said resin layer is so patterned as to be absent around wiring portions protruding from said electronic devices, around passive devices mounted between said electronic devices, around portions of circuit surfaces of said electronic devices where resin forming said resin layer effects a device characteristic, around electrode pads, and around bumps formed on said electrode pads.

4. An assembly as claimed in claim 2, wherein said resin layer has a function for flip chip bonding and a function for passivation.

5. An assembly as claimed in claim 4, wherein said resin layer is so patterned as to be absent around wiring portions protruding from said electronic devices, around passive devices mounted between said electronic devices, around portions of circuit surfaces of said electronic devices where resin forming said resin layer effects a device characteristic, around electrode pads, and around bumps formed on said electrode pads.

6. An assembly as claimed in claim 1, wherein said resin layer has a function for flip chip bonding and a function for passivation.

7. An assembly as claimed in claim 6, wherein said resin layer is so patterned as to be absent around wiring portions protruding from said electronic devices, around passive devices mounted between said electronic devices, around portions of circuit surfaces of said electronic devices where resin forming said resin layer effects a device characteristic, around electrode pads, and around bumps formed on said electrode pads.

8. An assembly as claimed in claim 1, wherein said resin layer is so patterned as to be absent around wiring portions protruding from said electronic devices, around passive devices mounted between said electronic devices, around portions of circuit surfaces of said electronic devices where resin forming said resin layer effects a device characteristic, around electrode pads, and around bumps formed on said electrode pads.

* * * * *